United States Patent
Forrest et al.

(10) Patent No.: US 9,130,170 B2
(45) Date of Patent: Sep. 8, 2015

(54) INVERTED ORGANIC PHOTOSENSITIVE DEVICE

(71) Applicants: Stephen R. Forrest, Ann Arbor, MI (US); Xiaoran Tong, Ann Arbor, MI (US); Jun Yeob Lee, Ann Arbor, MI (US); Yong Joo Cho, Ann Arbor, MI (US)

(72) Inventors: Stephen R. Forrest, Ann Arbor, MI (US); Xiaoran Tong, Ann Arbor, MI (US); Jun Yeob Lee, Ann Arbor, MI (US); Yong Joo Cho, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/666,664

(22) Filed: Nov. 1, 2012

(65) Prior Publication Data

US 2013/0105779 A1   May 2, 2013

Related U.S. Application Data

(60) Provisional application No. 61/554,324, filed on Nov. 1, 2011.

(51) Int. Cl.
*H01L 51/44* (2006.01)
*H01L 51/00* (2006.01)
*B82Y 10/00* (2011.01)
*H01L 27/30* (2006.01)
*H01L 27/146* (2006.01)
*H01L 51/42* (2006.01)

(52) U.S. Cl.
CPC .............. *H01L 51/003* (2013.01); *B82Y 10/00* (2013.01); *H01L 51/0097* (2013.01); *H01L 27/14643* (2013.01); *H01L 27/30* (2013.01); *H01L 51/0046* (2013.01); *H01L 51/0053* (2013.01); *H01L 51/0077* (2013.01); *H01L 51/0078* (2013.01); *H01L 51/424* (2013.01); *Y02E 10/549* (2013.01)

(58) Field of Classification Search
CPC ... H01L 27/302; H01L 51/424; H01L 51/441; H01L 27/30; H01L 27/14643
USPC .............. 257/21, 40, 184, 186, 461, E51.012
See application file for complete search history.

(56) References Cited

U.S. PATENT DOCUMENTS 4,550,982 A * 11/1985 Hirai .............................. 359/274
5,009,958 A *  4/1991 Yamashita et al. .......... 428/411.1
5,617,290 A *  4/1997 Kulwicki et al. ........... 361/321.4

(Continued)

FOREIGN PATENT DOCUMENTS

EP    0 948 004 A1    10/1999

OTHER PUBLICATIONS

Chang Hang Dong Kim et al. "Full color flexible displays on thin metal foil with reduced bending radius," Flexible Electronics&Displays Confrence and Exhibition, 2009, pp. 1-4, IEEE, Piscataway, NJ, USA, XO31471240, ISBN: 978-1-4244-4338-3.

(Continued)

*Primary Examiner* — Ida M Soward
(74) *Attorney, Agent, or Firm* — Finnegan, Henderson, Farabow, Garrett & Dunner LLP

(57) ABSTRACT

There is disclosed a method for preparing the surface of a metal substrate. The present disclosure also relates to an organic photovoltaic device including a metal substrate made by such method. Also disclosed herein is an inverted photosensitive device including a stainless steel foil reflective electrode, an organic donor-acceptor heterojunction over the reflective electrode, and a transparent electrode over the donor-acceptor heterojunction.

7 Claims, 8 Drawing Sheets

(56) References Cited

U.S. PATENT DOCUMENTS

| | | | |
|---|---|---|---|
| 6,278,055 B1* | 8/2001 | Forrest et al. | 136/263 |
| 6,297,495 B1* | 10/2001 | Bulovic et al. | 250/214.1 |
| 6,340,789 B1* | 1/2002 | Petritsch et al. | 136/263 |
| 8,022,623 B2* | 9/2011 | Rogojevic et al. | 313/510 |
| 8,586,976 B2* | 11/2013 | Matsuura et al. | 257/40 |
| 8,754,407 B2* | 6/2014 | Takemura et al. | 257/40 |
| 2005/0227406 A1* | 10/2005 | Shtein et al. | 438/99 |
| 2007/0215868 A1* | 9/2007 | Forrest et al. | 257/40 |
| 2009/0188558 A1* | 7/2009 | Jen et al. | 136/256 |
| 2010/0012178 A1* | 1/2010 | Yang et al. | 136/256 |
| 2010/0102304 A1* | 4/2010 | Forrest et al. | 257/40 |
| 2010/0282309 A1* | 11/2010 | Pschirer et al. | 136/255 |
| 2012/0161117 A1* | 6/2012 | Chen et al. | 257/40 |
| 2014/0021967 A1* | 1/2014 | Kang et al. | 324/679 |

OTHER PUBLICATIONS

"Mounting Media: waxes," 2013, XP055051846, retrieved from the Internet, URL: http://www.sun-way.com.tw.Files/DownloadFile/Wax.PDF.

* cited by examiner

Scan size: 5 x 5 μm

Scan size: 5 x 5 μm

INVERTED ORGANIC PHOTOSENSITIVE DEVICE

CROSS-REFERENCE TO RELATED APPLICATION

This application claims the benefit of U.S. Provisional Application No. 61/554,324, filed Nov. 1, 2011, which is incorporated herein by reference in its entirety.

STATEMENT REGARDING FEDERALLY SPONSORED RESEARCH

This invention was made with U.S. Government support under Contract No. DE-SC0001013, awarded by the Department of Energy. The government has certain rights in the invention.

JOINT RESEARCH AGREEMENT

The subject matter of the present disclosure was made by, on behalf of, and/or in connection with one or more of the following parties to a joint university-corporation research agreement: University of Michigan and Global Photonic Energy Corporation. The agreement was in effect on and before the date the subject matter of the present disclosure was prepared, and was made as a result of activities undertaken within the scope of the agreement.

The subject matter of the present disclosure is directed to a method for preparing the surface of a metal substrate. The present disclosure also relates to an organic photovoltaic device comprising a metal substrate made by such method. Also disclosed herein is an inverted organic photosensitive optoelectronic device comprising a reflective electrode comprising stainless steel foil, an organic donor-acceptor heterojunction over the reflective electrode, and a transparent electrode over the donor-acceptor heterojunction.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF=\{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF*(I_{SC}*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

The current-voltage characteristics of organic heterojunctions are often modeled using the generalized Shockley equation derived for inorganic diodes. However, since the Shockley equation does not rigorously apply to organic semiconductor donor-acceptor (D-A) heterojunctions (HJs), the extracted parameters lack a clear physical meaning.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction may also play an important role. The energy level offset at the organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices ($F \sim 10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency $\eta$ associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50$ Å) than the optical absorption length (~500 Å), requiring a tradeoff between using a thick, and therefore resistive, cell with multiple or highly folded interfaces, or a thin cell with a low optical absorption efficiency.

Conventional organic PV cells are fabricated on transparent substrates such as glass or plastic coated with a transparent conductor, such as indium tin oxide (ITO). Because these substrates can be expensive and/or an important element of the overall cost structure of the device, the use of such transparent conducting substrates has the potential to limit the cost-effectiveness of the overall device, especially in large-area applications. Inverted organic PV cells utilize a reflective substrate and a transparent top contact. This architecture eliminates the need for comparatively high-cost transparent substrates and allows for fabrication on arbitrary surfaces. This design significantly extends the application of organic PV cells, such as allowing for power-generating coatings or growth on flexible and inexpensive opaque substrates. Accordingly, there exists a need to develop an efficient and low-cost method for preparing such substrates.

There is disclosed a method for preparing the surface of a metal substrate, comprising:

(a) attaching a metal substrate to a rigid support structure to provide an exposed top surface;

(b) mechanically polishing the exposed top surface of said metal substrate with an inorganic abrasive slurry for a time sufficient to reduce the surface roughness of the top surface; and (c) applying an organic smoothing layer on the top surface to form a metal substrate having a planarized top surface.

In one embodiment, the rigid support structure comprises a belt, disc or plate, which can be made of any known rigid material, such as glass, plastic, or metal.

In one embodiment, the method described herein can be a continuous process, or a batch process. When a continuous process is used, the rigid support structure should be suitably adapted, such as in the form of a belt.

In one embodiment, the metal substrate may be removed from the rigid support structure prior to applying the organic layer. It is appreciated that the metal substrate can be bonded to the rigid support structure with any known bonding agents, such as a quartz wax. When a removable bonding agent is used, the method may further comprise sonicating the metal substrate in at least one solvent to remove any residual quartz wax, such as xylene, prior to applying the organic smoothing layer.

In one embodiment, the organic smoothing layer can be applied via solution processing, such as by one or more technique chosen from spin-coating, spin-casting, spray coating, dip coating, and doctor's blading.

In one embodiment, the organic smoothing layer comprises poly(3,4-ethylene dioxythiophene):poly(styrene sulfonate) (PEDOT:PSS).

In one embodiment, the mechanical polishing is performed for a time sufficient to reduce surface roughness below 20 nm, such as 3 nm or below. The time sufficient to reduce surface roughness ranges from 15-60 minutes, such as 20-50 minutes.

In one embodiment, the metal substrate comprises stainless steel, which may be mechanically polished using a slurry such as an aqueous suspension comprising an abrasive material, including aluminum oxide, such as calcined alumina.

The present disclosure also relates to organic photosensitive optoelectronic devices, such as organic PV devices, grown in an inverted manner. For purposes of this disclosure, growth in an inverted manner means starting with a reflective electrode and using a transparent top electrode. In some embodiments, the inverted organic PV devices described herein comprise:

a reflective electrode;

an organic donor-acceptor heterojunction over the reflective electrode; and a transparent electrode over the donor-acceptor heterojunction.

In some embodiments, the reflective electrode may comprise a substrate, such as the metal substrate described herein. In some embodiments, the electrode may comprise a low work function metal selected from steel, Ni, Ag, Al, Mg, In, and mixtures or alloys thereof.

In certain embodiments, the inverted organic PV devices described herein comprise: a surface-treated reflective electrode; an organic donor-acceptor heterojunction over the reflective electrode; and a transparent electrode over the donor-acceptor heterojunction.

In some embodiments, the donor of the organic donor-acceptor heterojunction may be selected from phthalocyanines, porphyrins, subphthalocyanines, and derivatives or transition metal complexes thereof. In some embodiments, the donor comprises boron subphthalocyanonine chloride (SubPc) or copper phthalocyanine (CuPc). In some embodiments, the acceptor of the organic donor-acceptor heterojunction is chosen from polymeric or non-polymeric perylenes, polymeric or non-polymeric naphthalenes, and polymeric or non-polymeric fullerenes. In some embodiments, the acceptor comprises $C_{60}$ or 3,4,9,10-perylenetetracarboxylic bis-benzimidazole (PTCBI).

In some embodiments, the transparent electrode is chosen from transparent oxides and metal or metal substitutes having a thickness sufficient to render them transparent or semi-transparent. In some embodiments, the transparent electrode is selected from transparent conducting oxides such as indium tin oxide (ITO), gallium indium tin oxide (GITO), and zinc indium tin oxide (ZITO).

In some embodiments, the inverted organic PV devices described herein may optionally comprise one or more blocking layers, such as an exciton blocking layer (EBL), between the reflective electrode and the transparent electrode. In some embodiments, the EBL may be selected from molybdenum trioxide, N,N'-diphenyl-N,N'-bis-alpha-naphthylbenzidine (NPD), aluminum tris(8-hydroxyquinoline) ($Alq_3$), carbazole biphenyl (CBP), bathocuproine (BCP), and tris(acetylacetonato) ruthenium (III) ($Ru(acac)_3$).

Also described herein are power-generating devices comprising at least one organic PV device which comprises:

a reflective electrode;

an organic donor-acceptor heterojunction over the reflective electrode; and a transparent electrode over the donor-acceptor heterojunction.

In some embodiments, the power-generating devices are formed on the metal substrate described herein. In some embodiments, the power generating device is formed directly on the enclosure of a device, wherein the device enclosure functions as a substrate and the reflective electrode is formed over the substrate.

A method for producing an organic PV device is also described, comprising:

providing a reflective electrode;

performing at least one surface treatment on the reflective electrode;

forming an organic donor-acceptor heterojunction over the reflective electrode; and forming a transparent electrode over the organic donor-acceptor heterojunction.

Also described are methods for generating and/or measuring electricity. In some embodiments, the method comprises:

providing light to an organic PV device comprising a reflective electrode;

forming an organic donor-acceptor heterojunction over the reflective electrode; and forming a transparent electrode over the donor-acceptor heterojunction.

In some embodiments, the substrate is reflective, such as, for example, a metal foil, and the electrode closest to the reflective substrate is formed from suitable transparent or semitransparent materials defined herein.

BRIEF DESCRIPTION OF THE DRAWINGS

FIG. 2 illustrates the surface of a stainless steel foil (SUS) substrate before and after polishing.

Figure 1:
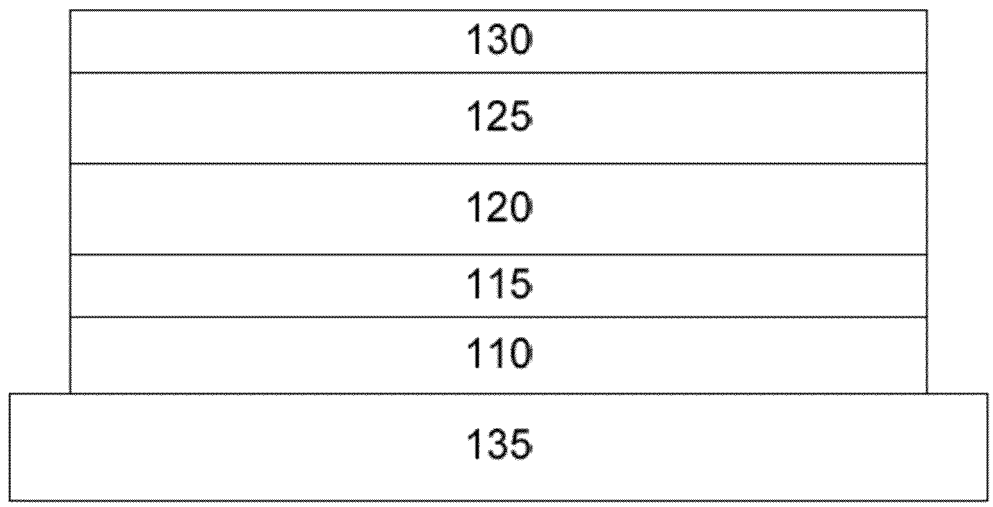
FIG. 1 shows an inverted organic PV device comprising a surface-treated reflective electrode formed over a substrate, an organic donor-acceptor heterojunction on top of the reflective electrode, and a transparent electrode on top of the donor-acceptor heterojunction.

Inverted organic photosensitive optoelectronic devices are described herein. The organic devices described may be used, for example, to generate a usable electrical current from incident electromagnetic radiation (e.g., PV devices) or may be used to detect incident electromagnetic radiation. Some embodiments may comprise an anode, a cathode, and a photoactive region between the anode and the cathode. The photoactive region is the portion of the photosensitive device that absorbs electromagnetic radiation to generate excitons that may dissociate in order to generate an electrical current. The devices described herein may also include at least one transparent electrode to allow incident radiation to be absorbed within the device. Several PV device materials and configurations are described in U.S. Pat. Nos. 6,657,378, 6,580,027, 6,352,777, and U.S. Patent Application Publication No. 2010/0102304 which are incorporated herein by reference for their disclosure of PV device materials and configurations.

As used herein, the term "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an inter-penetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

The terms "electrode" and "contact" are used herein to refer to a layer that provides a medium for delivering photogenerated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device. In a photosensitive optoelectronic device, it may be desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least about 50% of the ambient electromagnetic radiation in relevant wavelengths to be transmitted through the layer or layers. Similarly, layers which permit some, but less than about 50% transmission of ambient electromagnetic radiation in relevant wavelengths are said to be "semi-transparent."

The term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner. It will be noted that as the terms are used herein, anodes and cathodes may be electrodes or charge transfer layers.

As used herein, "top" means furthest away from the substrate structure (if present), while "bottom" means closest to the substrate structure. If the device does not include a substrate structure, then "top" means furthest away from the reflective electrode. For example, for a device having two electrodes, the bottom electrode is the electrode closest to the substrate structure, and is generally the first electrode fabricated. The bottom electrode has two surfaces, a bottom side closest to the substrate, and a top side further away from the substrate. Where a first layer is described as "disposed over" or "on top of" a second layer, the first layer is disposed further away from substrate. There may be other layers between the first and second layer, unless it is specified that the first layer is "in physical contact with" the second layer. For example, a cathode may be described as "disposed over" or "on top of" an anode, even though there are various organic layers in between.

FIG. 1 shows an example of inverted organic photosensitive optoelectronic device 100. The figures are not necessarily drawn to scale. Device 100 may include reflective substrate 110, donor layer 115, acceptor layer 120, optional blocking layer 125, and transparent electrode 130. Device 100 may be fabricated by depositing the layers described, in order. In some embodiments, the device described in FIG. 1 may optionally include a very thin, damage inducing metal layer between blocking layer 125 and transparent electrode 130 such that transparency is not impacted. Device 100 may also optionally include substrate structure 135. In some embodiments, the substrate structure may directly support reflective electrode 110.

The specific arrangement of layers illustrated in FIG. 1 is exemplary only, and is not intended to be limiting. For example, some of the layers (such as blocking layers) may be omitted. Other layers (such as reflective electrode or additional acceptor and donor layers) may be added. The order of layers may be altered. Arrangements other than those specifically described may be used. Additionally, the organic PV device may exist as a tandem device comprising one or more additional donor-acceptor layers. A tandem device may have charge transfer layers, electrodes, or charge recombination layers between the tandem donor-acceptor layers. The substrate and reflective electrode may be combined, the substrate may be reflective and the electrode transparent.

In some embodiments, reflective electrode 110 and substrate material 135 may be combined or formed of two metals. In some embodiments substrate 135 is reflective and electrode 110 is transparent.

Substrate 135, onto which the device may be grown or placed, may be any suitable material that provides the desired structural properties. The substrate may be flexible or rigid, planar or non-planar. The substrate may be transparent, translucent or opaque. Plastic, glass, and quartz are examples of rigid substrate materials. Plastic and metal foils are examples of flexible substrate materials. The material and thickness of the substrate may be chosen to obtain the desired structural and optical properties. In some embodiments, substrate 135 is stainless steel, such as a stainless steel foil (SUS). SUS substrates are relatively low cost compared to conventional materials, and provide better heat sinks during growth of layers.

In some embodiments, a metal substrate suitable to be used in organic PV may be prepared by mechanical polishing to reduce surface roughness, for example, below 3 nm, or between 1-3 nm. In some other embodiments, the surface of the metal substrate may be further smoothed by depositing a smoothing layer, such as an organic smoothing layer.

In some embodiments of the mechanical polishing process, a metal substrate is attached to a rigid support structure to provide an exposed top surface. The rigid support structure may be a belt, disc or plate, which can be made of any known rigid material, such as glass, plastic, or metal. In one embodiment, the method described herein can be a continuous process, or a batch process. When a continuous process is used, the rigid support structure should be suitably adapted, such as in the form of a belt.

In some embodiments, the metal substrate can be bonded to the rigid support structure with any known bonding agents, such as a quartz wax.

The exposed top surface of the metal substrate may be mechanically polished with inorganic abrasive slurry for a time sufficient to reduce the surface roughness of the surface. The slurry, such as an aqueous suspension, comprises an abrasive material, for example, aluminum oxide, such as calcined alumina.

In one embodiment, the mechanical polishing is performed for a time sufficient to reduce surface roughness to, for example, below 20 nm, such as 15 nm or below, 12 nm or below, 10 nm or below, 5 nm or below, and 3 nm or below. The time sufficient to reduce surface roughness may range from 15-60 minutes, such as 20-50 minutes, 20-40 minutes, 20-30 minutes, 15-45 minutes, and 30-45 minutes.

In one embodiment, the metal substrate may be removed from the rigid support structure prior to applying the organic layer in the next step. When a removable bonding agent is used, the method may further comprise sonicating the metal substrate in at least one solvent to remove any residual quartz wax, such as xylene, prior to applying the organic smoothing layer.

In some embodiments, the obtained top surface may be further planarized by applying an organic smoothing layer. In one embodiment, the organic smoothing layer comprises poly (3,4-ethylene dioxythiophene):poly(styrene sulfonate) (PEDOT:PSS).

In one embodiment, the organic smoothing layer can be applied via solution processing, such as by one or more techniques chosen from spin-coating, spin-casting, spray coating, dip coating, and doctor's blading.

In some other embodiments, the present disclosure also relates to organic photosensitive optoelectronic devices, such as organic PV devices, grown in an inverted manner. For purposes of this disclosure, growth in an inverted manner means starting with a reflective electrode and using a transparent top electrode. In some embodiments, the inverted organic PV devices described herein comprise:

a reflective electrode;

an organic donor-acceptor heterojunction over the reflective electrode; and a transparent electrode over the donor-acceptor heterojunction.

In some embodiments, the reflective electrode may comprise a substrate, such as the metal substrate described herein. In some embodiments, the electrode may comprise a low work function metal selected from steel, Ni, Ag, Al, Mg, In, and mixtures or alloys thereof.

In certain embodiments, the inverted organic PV devices described herein comprise: a surface-treated reflective electrode; an organic donor-acceptor heterojunction over the reflective electrode; and a transparent electrode over the donor-acceptor heterojunction.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

In some embodiments, the "electrodes" described herein may be composed of "metal" or "metal substitutes." Herein, the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n-F semiconductor with an optical bandgap of approximately 3.2 eV, rendering it transparent to wavelengths greater than approximately 3900 Å. Another suitable metal substitute is the transparent conductive polymer polyaniline (PANI) and its chemical relatives.

Metal substitutes may be further selected from a wide range of non-metallic materials, wherein the term "non-metallic" is meant to embrace a wide range of materials, provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes described herein may sometimes be referred to as "metal-free," wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents, they are "non-metallic" on several bases. They are neither pure free-metals nor are they alloys of free-metals. When metals are present in their metallic form, the electronic conduction band tends to provide, among other metallic properties, a high electrical conductivity as well as a high reflectivity for optical radiation.

Transparent electrode 130 may be chosen from transparent oxides and metal or metal substitutes having a thickness sufficient to render them transparent. Commonly used metal substitutes for electrodes and charge transfer layers would include doped wide-bandgap semiconductors, for example, transparent conducting oxides. In some embodiments, transparent electrode 130 may be selected from ITO, GITO, and ZITO. Other exemplary electrodes include highly transparent, non-metallic, low resistance cathodes such as those disclosed in U.S. Pat. No. 6,420,031, to Parthasarathy et al., or a highly efficient, low resistance metallic/non-metallic compound cathode such as those disclosed in U.S. Pat. No. 5,703, 436 to Forrest et al., both incorporated herein by reference for their disclosure of cathodes. Each type of cathode is typically prepared in a fabrication process that includes the step of sputter depositing an ITO layer onto either an organic material, such as CuPc, to form a highly transparent, non-metallic, low resistance cathode or onto a thin Mg:Ag layer to form a highly efficient, low resistance metallic/non-metallic compound cathode.

The devices described herein will comprise at least one "photoactive region" in which light is absorbed to form an excited state, or "exciton", which may subsequently dissociate in to an electron and a hole. The dissociation of the exciton will typically occur at the "heterojunction" formed by the juxtaposition of a donor layer and an acceptor layer. For example, in the device of FIG. 1, the "photoactive region" may include donor layer 115 and acceptor layer 120. Charge separation may occur predominantly at the organic heterojunction between donor layer 115 and acceptor layer 120. The built-in potential at the heterojunction is determined by the HOMO-LUMO energy level difference between the two materials contacting to form the heterojunction. The HOMO-LUMO gap offset between the donor and acceptor materials produces an electric field at the donor-acceptor interface that facilitates dissociation of excitons created within an exciton diffusion length of the interface into opposite signed carriers (holes and electrons).

Suitable materials comprising acceptor layer 120 may include, for example, polymeric or non-polymeric perylenes, naphthalenes, fullerenes or nanotubules. In some embodiments, acceptor layer 120 may comprise $C_{60}$, 3,4,9,10-perylenetetracarboxylic bis-benzimidazole (PTCBI). In other embodiments, acceptor layer 120 may comprise a fullerene material as described in U.S. Pat. No. 6,580,027, the description of fullerene material which is incorporated herein by reference. In some embodiments, donor layer 115 may comprise squaraines, phthalocyanine, porphyrin, boron sub-phthalocyanonine chloride (SubPc), copper phthalocyanine (CuPc), or a derivative or transition metal complex thereof such as aluminum phthalocyanine chloride (AlClPc).

Other suitable organic materials for use in the photoactive layers may include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic may refer to compounds which have an organic group bonded to a metal through a carbon-metal bond. Organometallic compounds may comprise, in addition to one or more carbon-metal bonds to an organic species, one or more donor bonds from a heteroatom. The carbon-metal bond to an organic species may refer, for example, to a direct bond between a metal and a carbon atom of an organic group, such as phenyl, alkyl, alkenyl, etc. The term cyclometallated refers to compounds that comprise a bidentate organometallic ligand so that, upon bonding to a metal, a ring structure is formed that includes the metal as one of the ring members.

As alluded to above with respect to the term "layer," it should be understood that the boundary of acceptor layer 120 and donor layer 115, as depicted in FIG. 1, may be imperfect, discontinuous, and/or otherwise represent an interpenetrating, entangled or convoluted network of donor and acceptor materials. For example, in some embodiments, while the organic donor-acceptor heterojunction may form a planar heterojunction, in others it may form a bulk heterojunction, nanocrystalline bulk heterojunction, hybrid planar-mixed heterojunction, or mixed heterojunction. In some embodiments, two or more organic donor-acceptor heterojunctions may be used to create a tandem inverted PV device.

Organic layers may be fabricated using vacuum deposition, spin coating, organic vapor-phase deposition, inkjet printing, and other methods known in the art.

Organic photosensitive optoelectronic devices of the embodiments described herein may function as a PV device, photodetector or photoconductor. Whenever the organic photosensitive optoelectronic devices described herein function as a PV device, the materials used in the photoconductive organic layers and the thicknesses thereof may be selected, for example, to optimize the external quantum efficiency of the device. Whenever the organic photosensitive optoelectronic devices described herein function as photodetectors or photoconductors, the materials used in the photoconductive organic layers and the thicknesses thereof may be selected, for example, to maximize the sensitivity of the device to desired spectral regions.

The device of FIG. 1 may further include one or more of blocking layer 125, such as the exciton blocking layers (EBLs) described in U.S. Pat. No. 6,097,147 and U.S. Pat. No. 6,451,415, Forrest et al., each of which is incorporated herein by reference for their disclosure of blocking layers. In certain embodiments, higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

Without being bound to any particular theory, it is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and an electrode, a charge transfer layer or a charge recombination layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. In certain embodiments, it may be desirable for a material used as a cathode side EBL to have a LUMO energy level closely matching the LUMO energy level of the adjacent acceptor material so that any undesired barrier to electrons is minimized.

It should be appreciated that the exciton blocking nature of a material is not necessarily an intrinsic property of its HOMO-LUMO energy gap. Whether a given material will act as an exciton blocker depends upon the relative HOMO and LUMO energy levels of the adjacent organic photosensitive material. Therefore, it may not be possible to identify a class of compounds in isolation as exciton blockers without regard to the device context in which they may be used. However, with the teachings herein, one of ordinary skill in the art may identify whether a given material will function as an exciton blocking layer when used with a selected set of materials to construct an organic PV device.

In some embodiments, blocking layer 125 may comprise an EBL situated between acceptor layer 120 and transparent electrode 130. Examples of suitable EBL materials include, but are not limited to, 2,9-dimethyl-4,7-diphenyl-1,10-phenanthroline (also called bathocuproin or BCP), which is believed to have a LUMO-HOMO energy level separation of about 3.5 eV, or bis(2-methyl-8-hydroxyquinolinoato)-aluminum(III)phenolate ($Alq_2OPH$). BCP may be an effective exciton blocker which can easily transport electrons to the cathode from an acceptor layer. In other embodiments, the EBL may be selected from molybdenum trioxide, N,N'-diphenyl-N,N'-bis-alpha-naphthylbenzidine (NPD), aluminum tris(8-hydroxyquinoline) (Alq3), carbazole biphenyl (CBP), and tris(acetylacetonato) ruthenium (III) ($Ru(acac)_3$).

In some embodiments, blocking layer 125 may comprise an EBL doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. BCP, as deposited in the devices described herein, may be amorphous. Amorphous BCP exciton blocking layers may exhibit film recrystallization, which may be especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a given device with a material having a LUMO energy level close to that of the EBL may help to insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

In some embodiments, the device of FIG. 1 may further comprise one or more transparent charge transfer layers or charge recombination layers. As described herein, charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more active layers. A charge recombination layer can be constructed of semi-transparent metal nanoclusters, nanoparticles or nanorods as described in U.S. Pat. No. 6,657,378, the disclosure of such semi-transparent metal nanoclusters, nanoparticles and nanorods which is incorporated herein by reference.

In some other embodiments, a smoothing layer may be situated between reflective electrode 110 (e.g., anode) and donor layer 115. A exemplary material for this layer comprises a film of 3,4-polyethylenedioxythiophene:polystyrenesulfonate (PEDOT:PSS). The introduction of the PEDOT: PSS layer between reflective electrode 110 (e.g., anode comprising ITO) and donor layer 115 (e.g., CuPc) may lead to greatly improved fabrication yields. Without being bound to a particular theory, it is believed that the improved fabrication yields may be a result of the ability of the spin-coated PEDOT:PSS film to planarize the ITO, whose rough surface could otherwise result in shorts through the thin molecular layers.

In a further embodiment, one or more of the layers of the FIG. 1 device may undergo surface treatments. For example, one or more of the layers may be treated with plasma prior to depositing the next layer. The layers may be treated, for example, with a mild argon or oxygen plasma. This treatment may be beneficial in reducing the series resistance. It may be advantageous to subject an optional PEDOT:PSS layer to a mild plasma treatment prior to deposition of the next layer. Alternatively, one or more of the layers may be exposed to ultra-violet ozone (UV-O$_3$) treatment. In at least one embodiment, the reflective electrode (e.g., anode layer) is exposed to a surface treatment.

The embodiments described herein also include a method for producing the organic PV device of FIG. 1, comprising: providing reflective electrode 110, performing at least one surface treatment on reflective electrode 110, forming an organic donor-acceptor heterojunction (e.g., donor layer 115 and acceptor layer 120) over reflective electrode 110, and forming transparent electrode 130 over said organic donor-acceptor heterojunction.

The embodiments described herein also include methods for generating and/or measuring electricity. In some embodiments, that method comprises: providing light to the device of FIG. 1, which comprises reflective electrode 110, organic donor-acceptor heterojunction on top of said reflective electrode (e.g., donor layer 115 and acceptor layer 120), and transparent electrode 130 on top of said donor-acceptor heterojunction.

In some embodiments, a power-generating device is described, which may include at least one device of FIG. 1, comprising: a reflective electrode 110; organic donor-acceptor heterojunction on top of said reflective electrode (e.g., donor layer 115 and acceptor layer 120); and transparent electrode 130 on top of said donor-acceptor heterojunction. In some embodiments, the device may be in the form of a paint, film, or foil. For example, in one embodiment, device 100 can be formed on substrate structure 135, which comprises a film, foil, or the like, or formed directly on the enclosure of a device, such as applying paint. In some embodiments, the device displays a rip in a range from 1% to 4%, for example, from about 2% to 3%. In some embodiments, the device displays a $V_{OC}$ in a range from 0.2 V to 1.5 V, such as about 0.8 V to about 1.2 V. In some embodiments, the device displays a FF in the range of 0.4 to 0.85, such as 0.5 to 0.6.

In further embodiments, the organic photosensitive optoelectronic devices described herein may function as photodetectors. In this embodiment, the device may be a multilayer organic device. In this case, an external electric field may be generally applied to facilitate extraction of the separated charges.

Coatings may be used to focus optical energy into desired regions of device. See, e.g., U.S. Pat. No. 7,196,835, which is incorporated by reference for such coatings.

The simple layered structure illustrated in FIG. 1 is provided by way of non-limiting example, and it is understood that embodiments described herein may be used in connection with a wide variety of other structures. The specific materials and structures described are exemplary in nature, and other materials and structures may be used. Functional organic photosensitive optoelectronic devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

The methods and devices described herein will be further described by the following non-limiting examples, which are intended to be purely exemplary.

EXAMPLE 1

A stainless steel foil (SUS) substrate was prepared for photovoltaic device application.

Figure 2A:
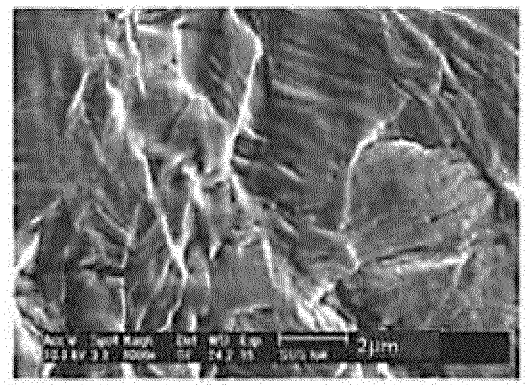
FIG. 2(a) is a scanning electron microscope (SEM) image of the SUS substrate before polishing.
Figure 2B:
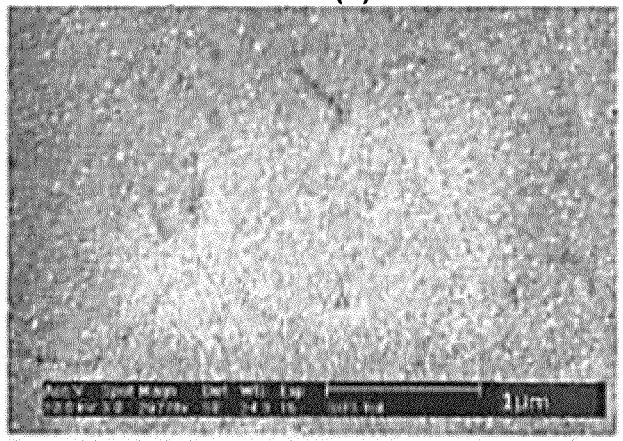
FIG. 2(b) shows an SEM image of the SUS substrate after polishing.
Figure 2C:
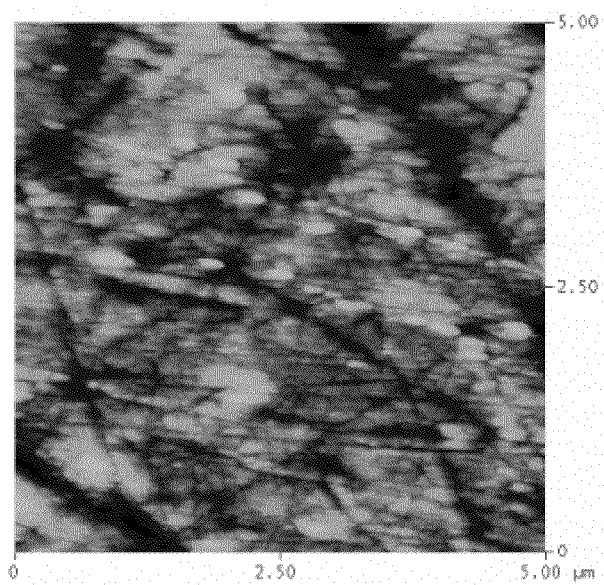
FIG. 2(c) is an Atomic Force Microscopy (AFM) image of the same SUS substrate after polishing, exhibiting a reduced surface roughness. (Image area 5×5 µm, root-mean-square (RMS) roughness 1.63 nm.)

First, the foil substrates (about 76 µm thick) were bonded to a 105 mm glass carrier disc using quartz wax heated to 80° C. After they were cooled down to room temperature, the glass carrier was mounted onto a vacuum chuck on the lapping jig, and the foils were then polished at 20 rpm under 1300 gram of force, using a free flowing slurry composed of 1 micron calcined aluminum oxide and deionized (DI) water for about 30-45 minutes. The foils were removed from the glass carrier by melting the wax. The detached foils were sonicated in xylene to remove the residual wax, and then cleaned in acetone followed by boiling isopropanol. The resulting surface was non-directional, highly reflective and sufficiently smooth for thin-film solar cell fabrication. As seen in FIG. 2(b) and FIG. 2(c), the surface roughness was largely reduced to 1.63 nm after polishing, compared to the surface before polishing, as seen in FIG. 2(a). A layer PEDOT:PSS was then spin-casted at 1000 rpm for 30 seconds followed by 6000 rpm for 1 minute to provide a better planarized surface and better wetting for the metal electrode. This preparation method is simple and low-cost. Organic solar cells can be grown on the SUS substrate prepared by this method and maintain comparable efficiency.

EXAMPLE 2

Figure 3:
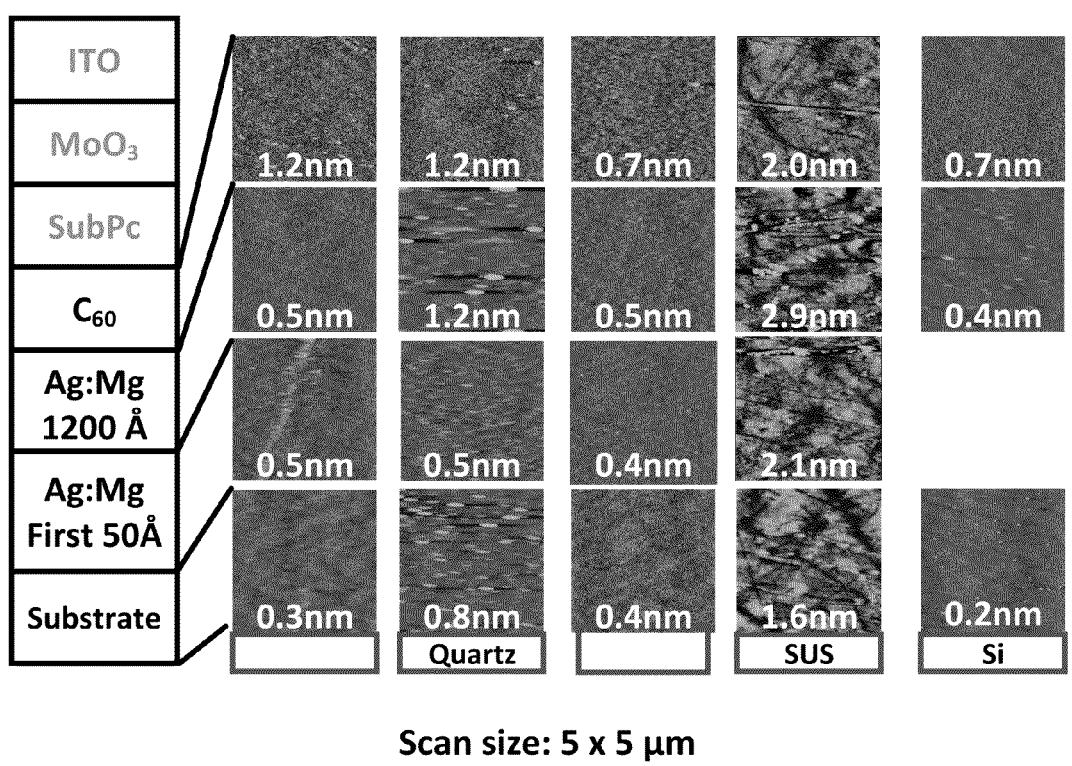
FIG. 3 illustrates surface roughness evolution of photosensitive devices deposited on various substrates. Shown are the images and RMS surface roughness of the layers, including substrate, Ag:Mg (first 50 Å and 1200 Å), and $C_{60}$, during deposition successively on various substrates (from left to right, glass, quartz, thick $SiO_2$ on Si, SUS, and Si) using AFM (image area 5×5 µm).
Figure 4:
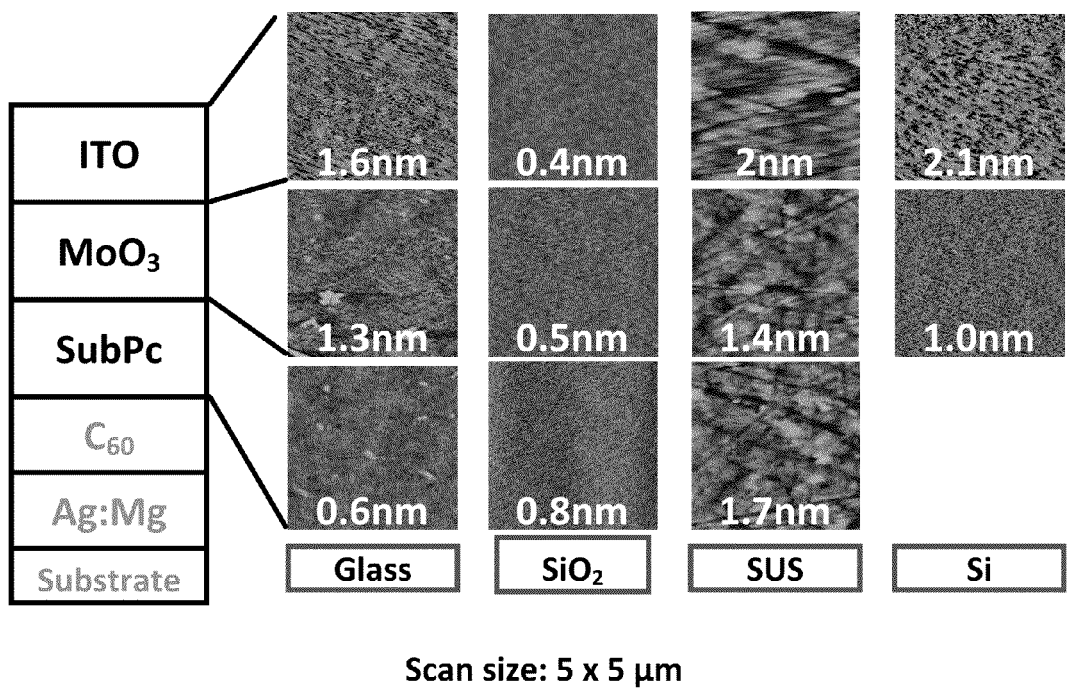
FIG. 4 illustrates surface roughness evolution of photosensitive devices deposited on various substrates. Shown are the images and RMS surface roughness of the layers, including SubPc, $MoO_3$, and ITO, during deposition successively on various substrates (from left to right, glass, thick $SiO_2$ on Si, SUS and Si) using AFM (image area 5×5 µm).

The SUS substrate, prepared according to the method described in Example 1, was used in making an organic photosensitive device (OPV). First, 1200 Å of Ag:Mg was thermally evaporated onto SUS in order to modify the cathode workfunction. Then OPV layers in the sequence of C$_{60}$ 500 Å/SubPc 110 Å/MoO$_3$ 300 Å were thermally evaporated at a rate of 1 Å/s. A 500 Å thick ITO top electrode was deposited by RF sputtering at a rate of 0.1 Å/s in Argon. The surface roughness of each layer of the device using SUS was compared with that of other devices which have identical material for each layer except the substrate (substrate/Ag:Mg/C$_{60}$/SubPc/MoO$_3$/ITO). The substrates for comparison with SUS included glass, quartz, thick SiO$_2$ on Si, and Si. FIG. 3 and FIG. 4 illustrate surface roughness evolution of devices deposited on various substrates (from left to right, glass, quartz (not shown in FIG. 5), thick SiO$_2$ on Si, SUS and Si) using Atomic Force Microscopy (AFM).

The RMS (root-mean-square) surface roughness of the layer substrate, Ag:Mg (first 50 Å), Ag:Mg (1200 Å), SubPc, MoO$_3$, and ITO during deposition successively on various substrates measured by AFM are listed in TABLE 1. See also FIG. 3 and FIG. 4.

TABLE 1

| RMS surface roughness (nm) | Glass | Quartz | SiO$_2$ | SUS | Si |
|---|---|---|---|---|---|
| ITO | 1.6 | | 0.4 | 2.0 | 2.1 |
| MoO$_3$ | 1.3 | | 0.5 | 1.4 | 1.0 |
| SubPc | 0.6 | | 0.8 | 1.7 | |
| C$_{60}$ | 1.2 | 1.2 | 0.7 | 2.0 | 0.7 |

TABLE 1-continued

| RMS surface roughness (nm) | Glass | Quartz | SiO$_2$ | SUS | Si |
|---|---|---|---|---|---|
| Ag:Mg - 1200 Å | 0.5 | 1.2 | 0.5 | 2.9 | 0.4 |
| Ag:Mg - first 50 Å | 0.5 | 0.5 | 0.4 | 2.1 | |
| Substrate | 0.3 | 0.8 | 0.4 | 1.6 | 0.2 |

The surface of SUS, after mechanical polishing, was slightly rougher (1.6 nm) than the other substrates. For example, the roughness was 0.3 nm for glass, 0.8 nm for quartz, 0.4 nm for SiO$_2$, and 0.2 nm for Si. The layers deposited successively on the SUS substrate, however, maintained comparable degrees of roughness, ranging from 1.4 to 2.9 nm. For example, 2.1 nm for the first 50 Å of Ag:Mg layer, 2.9 nm for the next 1200 Å of Ag:Mg, 2.0 nm for C$_{60}$, 1.7 nm for SubPC, 1.4 nm for MoO$_3$, and 2.0 nm for ITO.

EXAMPLE 3

A planar IOPV using SUS as substrate SUS/PEDOT:PSS/Ag:Mg/C$_{60}$/SubPc/MoO$_3$/ITO) was prepared. PEDOT:PSS was spin-casted at 1000 rpm for 30 seconds followed by 6000 rpm for 1 minute to provide a better planarized surface and better wetting for the metal electrode. The rest of the device was prepared according to the method described in Example 2.

Figure 6:
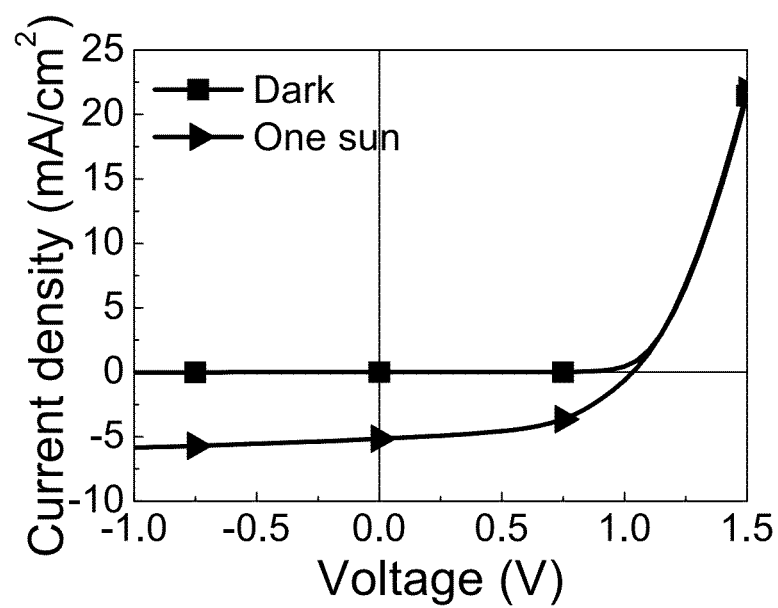
FIG. 6 illustrates the current density-voltage (J-V) characteristics for planar IOPV (SUS/PEDOT:PSS/Ag:Mg/$C_{60}$/SubPc/$MoO_3$/ITO) in the dark (square) and under simulated one sun AM1.5G illumination (triangle).
Figure 7:
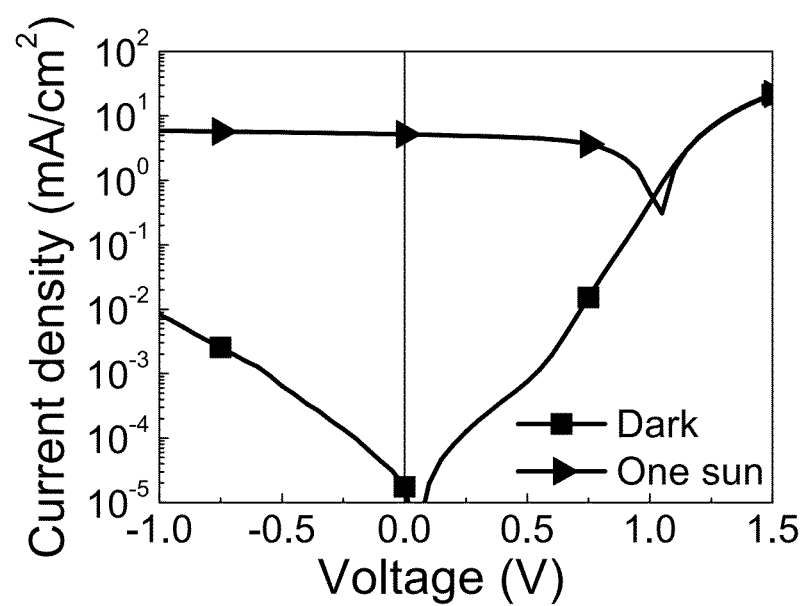
FIG. 7 illustrates the current density-voltage (J-V) characteristics for planar IOPV (SUS/PEDOT:PSS/Ag:Mg/$C_{60}$/SubPc/$MoO_3$/ITO) in the dark (square) and under simulated one sun AM1.5G illumination (triangle).

Current-voltage measurements were used to characterize the performance of the cells in the dark and under simulated AM 1.5 G simulated solar illumination (uncorrected for solar spectral mismatch) using a 150 W Xenon arc lamp. Performance data for the device are shown in FIGS. 5-7.

Figure 5:
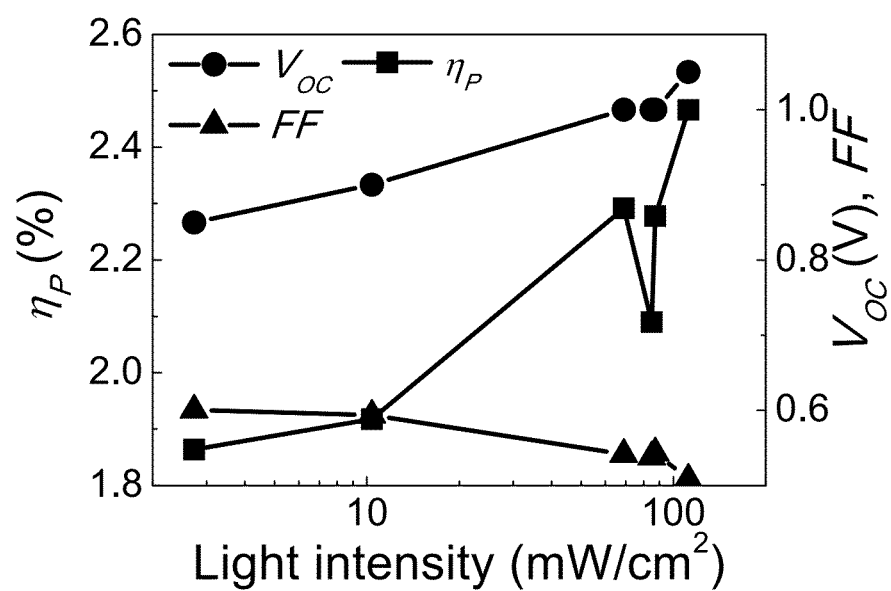
FIG. 5 illustrates $\eta_P$ (square), $V_{OC}$ (circle), and FF (triangle) versus power intensity for a planar IOPV (SUS/PEDOT:PSS/Ag:Mg/$C_{60}$/SubPc/$MoO_3$/ITO).

Performance for this cell as a function of illumination intensity is shown in FIG. 5, which illustrates η$_P$ (Black square), V$_{OC}$ (Green square), and FF (triangle) versus light intensity for the device. Under 1 sun AM 1.5 G solar illumination, the IOPV displayed a V$_{OC}$ of 1.0 V, a FF of 0.56, leading to a η$_P$ of 2.3%. The dark current-voltage current curve was fit to the modified ideal diode equation:

$$J_D = J_S \left\{ \exp\left[\frac{q(V - J_D R_{SA})}{nkT}\right] - 1 \right\}$$

giving n of 3, R$_{SA}$ of 0.007 Ω-cm$^2$, and J$_S$ of 3×10$^{-6}$ A/cm$^2$.

The current density vs. voltage characteristics in the dark (square) and under one sun illumination (triangle) are shown in linear (FIG. 6) and logarithmic (FIG. 7) scales respectively. The device demonstrated relatively low dark current, indicating that the smoothing SUS substrate sufficiently reduced surface roughness, which is known to cause leakage current.

EXAMPLE 4

The IOPV grown on SUS, as described in Example 3 was compared with a conventional OPV using ITO-coated glass as substrate, and an IOPV with quartz as substrate.

Figure 8:
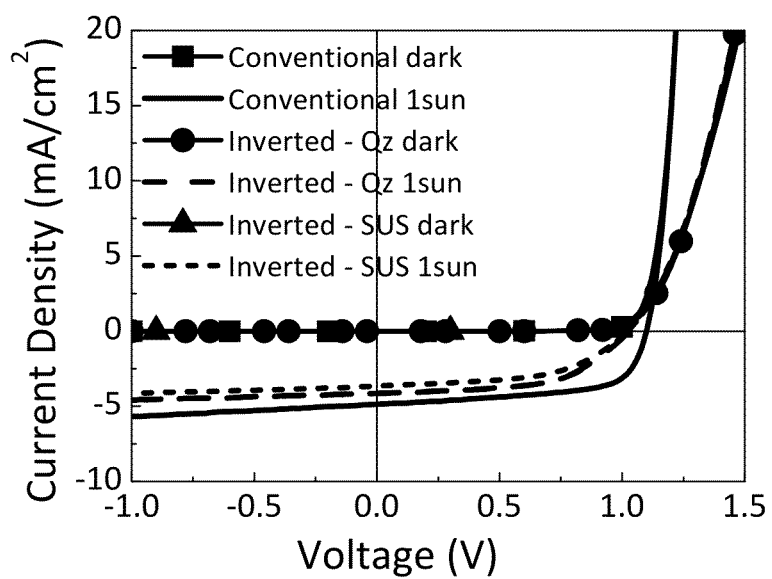
FIG. 8 illustrates the current density-voltage (J-V) characteristics for (1) conventional IOPV in the dark (square) and under one sun, AM1.5G simulated illumination; (2) IOPV on quartz substrate in the dark (circle) and under one sun, AM1.5G simulated illumination; (3) IOPV on SUS substrate in the dark (triangle) and under one sun, AM1.5G simulated illumination. Fits according to the theory in text are indicated by the solid line, long dashed line and short dashed line for devices (1), (2) and (3), respectively.

FIG. 8 illustrates the current density-voltage (J-V) characteristics of the three devices: (1) conventional IOPV in the dark (square) and under 1 sun, AM 1.5 G simulated illumination (solid line); (2) IOPV on quartz substrate in the dark (circle) and under 1 sun, AM 1.5 G simulated illumination (long dashed line); (3) IOPV on SUS substrate in the dark (circle) and under 1 sun, AM 1.5 G simulated illumination (short dashed line). Fits according to the theory in text are indicated by the thin solid line, long dashed line and short dashed line for devices (1), (2) and (3), respectively.

Power efficiency η$_P$, open circuit voltage V$_{OC}$, and the fill factor FF were calculated according to the equations described in the disclosure and are listed in TABLE 2.

TABLE 2

| | Conventional IOPV | IOPV on quartz | IOPV on SUS |
|---|---|---|---|
| η$_P$ | 3.3% | 2.4% | 2.3% |
| V$_{OC}$ | 1.0 V | 1.0 V | 1.0 V |
| FF | 0.61 | 0.56 | 0.56 |

As seen, the IOPV grown on SUS achieved a comparable efficiency with the other two devices. The power conversion efficiency of 2.3%, approximately the same as that of IOPV grown on quartz (2.4%), and about 70% that of a conventional planar solar cell on ITO-coated glass (3.3%).

Although the present disclosure is described with respect to particular examples and embodiments, it is understood that the devices described herein are not limited to these examples and embodiments. The embodiments as claimed may therefore include variations from the particular examples and preferred embodiments described herein, as will be apparent to one of skill in the art.

What is claimed is:

1. An inverted photosensitive device comprising:
   a surface-treated reflective electrode comprising stainless steel foil;
   an organic donor-acceptor heterojunction over said reflective electrode; and
   a transparent electrode over said donor-acceptor heterojunction.

2. The inverted photosensitive device of claim 1, wherein the donor of the organic donor-acceptor heterojunction comprises a material selected from phthalocyanines, porphyrins, subphthalocyanines, and derivatives or transition metal complexes thereof.

3. The inverted photosensitive device of claim 1, wherein the donor of the donor-acceptor heterojunction comprises boron subphthalocyanonine chloride or copper phthalocyanine.

4. The inverted photosensitive device of claim 1, wherein the acceptor of the organic donor-acceptor heterojunction comprises a material selected from polymeric and non-polymeric perylenes, polymeric and non-polymeric naphthalenes, and polymeric and non-polymeric fullerenes.

5. The inverted photosensitive device of claim 1, wherein the acceptor of the organic donor-acceptor heterojunction comprises C$_{60}$ or 3,4,9,10-perylenetetracarboxylic bis-benzimidazole.

6. The inverted photosensitive device of claim 1, wherein the transparent electrode permits at least about 50% of ambient electromagnetic radiation to be transmitted through said electrode.

7. The inverted photosensitive device of claim 1, wherein the device further comprises an exciton blocking layer.

* * * * *